(12) United States Patent
Faure et al.

(10) Patent No.: US 11,662,380 B2
(45) Date of Patent: May 30, 2023

(54) BUILT-IN SELF-TEST FOR DIE-TO-DIE PHYSICAL INTERFACES

(71) Applicant: Apple Inc., Cupertino, CA (US)

(72) Inventors: Fabien S. Faure, Santa Clara, CA (US); Arnaud J. Forestier, San Diego, CA (US); Vikram Mehta, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 9 days.

(21) Appl. No.: 17/320,165

(22) Filed: May 13, 2021

(65) Prior Publication Data

US 2022/0365135 A1 Nov. 17, 2022

(51) Int. Cl.
| | |
|---|---|
| *G01R 31/3177* | (2006.01) |
| *G01R 31/317* | (2006.01) |
| *G01R 31/3185* | (2006.01) |
| *G01R 31/319* | (2006.01) |
| *G01R 31/28* | (2006.01) |
| *G01R 31/66* | (2020.01) |

(52) U.S. Cl.
CPC ... *G01R 31/3177* (2013.01); *G01R 31/31713* (2013.01); *G01R 31/31725* (2013.01); *G01R 31/2889* (2013.01); *G01R 31/31712* (2013.01); *G01R 31/31715* (2013.01); *G01R 31/31716* (2013.01); *G01R 31/31723* (2013.01); *G01R 31/31926* (2013.01); *G01R 31/318572* (2013.01); *G01R 31/66* (2020.01)

(58) Field of Classification Search
CPC ........ G01R 31/3177; G01R 31/318572; G01R 31/31723; G01R 31/2889; G01R 31/31926; G01R 31/31712; G01R 31/66; G01R 31/31713; G01R 31/31725

See application file for complete search history.

(56) References Cited

U.S. PATENT DOCUMENTS

| | | | |
|---|---|---|---|
| 7,296,202 B2 | 11/2007 | Richter | |
| 7,653,505 B1* | 1/2010 | Simmons | ......... G01R 31/31715 714/724 |
| 8,832,511 B2 | 9/2014 | Chen et al. | |
| 9,121,894 B2 | 9/2015 | Hashimoto et al. | |
| 9,423,454 B2 | 8/2016 | Kim | |
| 9,726,722 B1* | 8/2017 | Solt | ..................... G01R 31/3177 |
| 2011/0267086 A1* | 11/2011 | Pagani | ............... G01R 31/2884 324/754.21 |
| 2012/0278027 A1* | 11/2012 | Jindal | .............. G01R 31/31715 702/118 |

* cited by examiner

*Primary Examiner* — Cynthia Britt
*Assistant Examiner* — Sazzad Hossain
(74) *Attorney, Agent, or Firm* — Kowert, Hood, Munyon, Rankin & Goetzel, P.C.; Scott W. Pape; Dean M. Munyon

(57) ABSTRACT

A system includes a first integrated circuit including a first interface circuit with a first transmit pin and a first receive pin, and a first test circuit. The system also includes a second integrated circuit including a second interface circuit with a second receive pin coupled to the first transmit pin, and a second transmit pin coupled to the first receive pin. The second integrated circuit further includes a second test circuit configured to route signals from the second receive pin to the second transmit pin, such that the sent test signal is received by the second receive pin, bypasses the second test circuit, and is routed to the second transmit pin. The first test circuit is further configured to receive the routed test signal on the first receive pin via the second conductive path.

20 Claims, 10 Drawing Sheets

BUILT-IN SELF-TEST FOR DIE-TO-DIE PHYSICAL INTERFACES

BACKGROUND

Technical Field

Embodiments described herein are related to systems-on-a-chip (SOCs) and, more particularly, to methods for testing interfaces coupled to multiple SOCs.

Description of the Related Art

System-on-a-chip (SOC) integrated circuits (ICs) generally include one or more processors that serve as central processing units (CPUs) for a system, along with various other components such a memory controllers and peripheral components. Additional components, including one or more additional ICs, can be included with a particular SOC IC to form a given device. Increasing a number of processors and/or other discrete components included on an SOC IC may be desirable for increased performance.

Reuse of an existing IC design may reduce costs compared to designing, verifying, manufacturing, and evaluating a new IC design. One technique for scaling a single IC design across a range of applications is to utilize multiple instances of the integrated circuit in applications that emphasize performance over costs, and using a single instance of the integrated circuit in the cost sensitive applications. In some devices, multiple integrated circuit dies may be coupled together via respective interface circuits on each die and then packaged together in a single chip package, thereby reducing an area required to mount the device to a circuit board. While such multi-die packaging may reduce system costs and/or reduce board space for mounting the chip, testing of the interconnects between the multiple dies may present a problem.

SUMMARY

In an embodiment, an apparatus includes a first integrated circuit that includes a first interface circuit with a first transmit pin and a first receive pin, and a first test circuit configured to send a test signal via the first transmit pin. The system also includes a second integrated circuit that includes a second interface circuit with a second receive pin coupled, via a first conductive path, to the first transmit pin, and a second transmit pin coupled, via a second conductive path, to the first receive pin. The second integrated circuit also includes a second test circuit configured to, in response to entering a particular test mode, route signals from the second receive pin to the second transmit pin, such that the sent test signal is received by the second receive pin, bypasses the second test circuit, and is routed to the second transmit pin. The first test circuit is further configured to receive the routed test signal on the first receive pin via the second conductive path, and to determine one or more qualities of the first conductive path and the second conductive path using a comparison of the sent test signal and the routed test signal.

In a further example, the second test circuit may be further configured to couple the second receive pin to the second transmit pin in response to receiving a test mode indication via the second interface circuit. In one example, the first test circuit may be further configured to transmit the test mode indication via the first interface circuit in response to entering a given test mode of a plurality of test modes.

In an example, the first test circuit may be further configured to, in response to entering a different test mode, route signals from the first receive pin to the first transmit pin, such that a second test signal received by the first receive pin, bypasses the first test circuit, and is routed to the first transmit pin. In another embodiment, the second test circuit may be further configured to send the second test signal via the second transmit pin, to receive the routed second test signal on the second receive pin via the first conductive path, and to determine one or more qualities of the first conductive path and the second conductive path using a comparison of the second test signal and the routed second test signal.

In a further embodiment, the first interface circuit may further include a third receive pin and the second interface circuit may further include a third transmit pin. The second test circuit may be further configured to route signals from the second receive pin to the second transmit pin based on a particular pin map, and in response to entering a different test mode, route signals from the second receive pin to the third transmit pin based on a different pin map. In an embodiment, the first and second conductive paths may be permanent attachments between the first and second integrated circuits.

BRIEF DESCRIPTION OF THE DRAWINGS

The following detailed description makes reference to the accompanying drawings, which are now briefly described.

Figure 1:
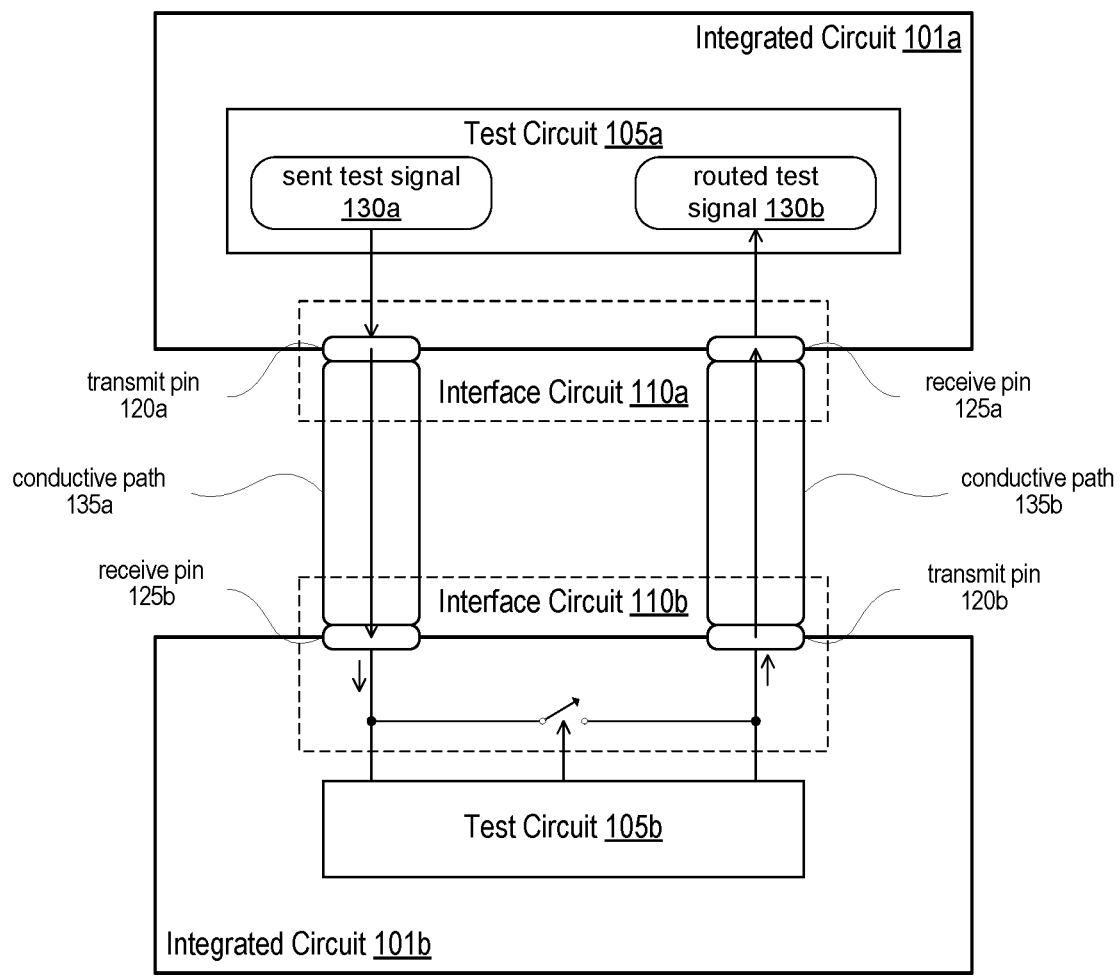
FIG. 1 illustrates a block diagram of an embodiment of a system with two integrated circuits coupled together each integrated circuit including a respective test circuit.

While embodiments described in this disclosure may be susceptible to various modifications and alternative forms, specific embodiments thereof are shown by way of example in the drawings and will herein be described in detail. It should be understood, however, that the drawings and detailed description thereto are not intended to limit the embodiments to the particular form disclosed, but on the contrary, the intention is to cover all modifications, equivalents and alternatives falling within the spirit and scope of the appended claims.

DETAILED DESCRIPTION OF EMBODIMENTS

As described above, multiple integrated circuit dies may be coupled together by connecting two or more dies together using, for example, bond wires and/or a interposer circuit to connect an external interface circuit of each die together. In some cases, two integrated circuits may be designed to be attached together directly, e.g., in a face-to-face fashion with the external interfaces aligned. After the integrated circuits have been coupled, they may be encapsulated in a plastic body or other form of packaging to protect the integrated circuits from physical damage during assembly or use of a product that includes the integrated circuits. Once the integrated circuits have been attached and encapsulated, any physical access to the interconnects between the integrated circuits may be eliminated.

During a product assembly process, however, characteristics of the physical connection between the integrated circuits may be affected. For example, solder joints or wires may be damaged, resulting in one or more broken connections or an increased impedance in one or more connections. In another example, wires may be bent or solder may spread, allowing two separate connections to come into close contact, thereby resulting in an electromagnetic coupling or even a short between the connections. Accordingly, the combination of integrated circuits may be tested to verify an acceptable level of integrity of signals exchanged across the external interface circuits.

Testing a physical connection between two or more integrated circuits may require coordination between the two or more integrated circuits, including, e.g., synchronizing the two or more integrated circuits to perform different portions of a same test routine. For example, a first of the integrated circuits may send a particular test stimulus which is received by a second of the integrated circuits. A comparison between sent test signals and received test signals may allow for a determination of one or more qualities of the connections between the integrated circuits. To perform the comparison, however, a processing circuit needs to have access to both the test stimulus and the test results. Since different ones of the integrated circuits have each piece, testing may be complicated by transferring data to a common entity (the first integrated circuit, the second integrated circuit, and/or a third processing circuit such as a test system) for the comparison and analysis. In a simple system with a limited number of physical connections (e.g., a dozen or two), transferring test information to a common entity may be an acceptable solution. In a multi-die system with a large number of inter-die connections (e.g., hundreds or thousands of physical connections) the coordination requirements to collect and transfer all the necessary test information to a common entity may result in an unacceptably long and/or complex test process.

Embodiments are presented herein that reduce the complexity that synchronization of two integrated circuits may introduce in a testing process. One technique for evaluating a pair of conductive paths, includes having a transmit pin of a first integrated circuit coupled to a receive pin of a second integrated circuit via a first of the conductive paths, and a receive pin of the first integrated circuit coupled to a transmit pin of the second integrated circuit via the second conductive path. A first test circuit on the first integrated circuit sends a test signal via the transmit pin of the first interface circuit. A test circuit of the second integrated circuit couples the receive pin of the second interface circuit to the transmit pin of the second interface circuit, thereby routing the test signal sent by the first test circuit back to the receive pin of the first interface circuit. For example, the second integrated circuit enters "loop-back" mode while the first integrated circuit performs a built-in self-test (BIST) operation. The first test circuit determines qualities of the pair of conductive paths based on a comparison of the sent and received test signals.

Such a technique may reduce or eliminate synchronization constraints between the first and second integrated circuits. By enabling a loop-back mode in the second integrated circuit before the first integrated circuit sends the test signal, the test signal may be routed back to the first integrated circuit, via the pair of conductive paths, allowing the first integrated circuit to access both test stimulus and test results for a comparison. In addition, the first integrated circuit may track timing differences between the sending and receiving. Such timing differences may be utilized in the comparison.

FIG. 1 illustrates a block diagram of an embodiment of a system that includes two integrated circuits coupled via a pair of conductive paths. As illustrated, system 100 includes integrated circuits 101a and 101b (collectively integrated circuits 101), coupled via respective interface circuits 110a and 110b (collectively interface circuits 110). Each of interface circuits 110 include a respective transmit pin 120a and 120b, and a respective receive pin 125a and 125b. Integrated circuits 101 further include a respective test circuit 105a and 105b (collectively test circuits 105). System 100, in various embodiments, may be a packaged computer chip, a circuit board that includes one or more computer chips, or a computer device such as a desktop computer, a laptop computer, a smartphone, a tablet computer, a wearable device, a digital assistant device, and the like.

As shown, integrated circuit 101a includes interface circuit 110a with a physical pin layout that includes transmit pin 120a and receive pin 125a. Integrated circuit 101a is an IC design that performs any particular function with a finite amount of bandwidth. For example, integrated circuit 101a may be a general-purpose microprocessor or microcontroller, a digital-signal processor, a graphics or audio processor, or other type of system-on-a-chip. In some systems, a single instance of an integrated circuit 101 may provide suitable performance bandwidth. In other applications, multiple integrated circuits 101 may be used to provide additional processing capabilities to system 100.

In the illustrated embodiment, integrated circuit 101a is coupled to integrated circuit 101b to provide additional capabilities. In a similar manner as integrated circuit 101a, integrated circuit 101b includes interface circuit 110b that further includes transmit pin 120b and receive pin 125b. Receive pin 125b is coupled, via conductive path 135a, to transmit pin 120a, and transmit pin 120b is coupled, via conductive path 135b, to receive pin 120a. Conductive paths 135a and 135b may be permanent attachments between integrated circuits 101a and 101b. Conductive paths 135a and 135b may include any suitable technique for establishing an electrical connection between two or more integrated circuits, such as, bond wires, solder bumps, interposer circuits, and the like.

The additional capabilities provided by integrated circuit 101b may be increased performance and/or additional features. It is contemplated that interface circuit 110 with a particular physical pin layout may be used to couple two instances of a same integrated circuit design. In other embodiments, a same design for interface circuit 110 may be used on two different integrated circuit designs, allowing different integrated circuits to be coupled in a similar manner. For example, a family of different integrated circuit designs may include the same interface circuit design across the family in order to enable various combinations of instances of two or more of the integrated circuits. Accordingly, integrated circuit 101b may or may not be a different instance of a same IC design as integrated circuit 101a.

Test circuits 105 are used, respectively, by integrated circuits 101 to perform one or more test procedures. These test procedures may include any suitable combination of BIST capabilities, scan testing, and functional testing. Some test features may include usage of additional test equipment external to system 100. A BIST operation, in some embodiments, may be capable of being performed without such external equipment, for example, by being initiated by a particular user input to system 100.

Test circuit 105a, as shown, is configured to send test signal 130 via transmit pin 120a. For clarity, test signal 130 is shown in FIG. 1 as sent test signal 130a to depict the test signal as it is sent, and as routed test signal 130b to depict the test signal as it is received by test circuit 105a. Test circuit 105b is configured to, in response to entering a particular test mode, route signals from receive pin 125b to transmit pin 120b, such that sent test signal 130a is received by receive pin 125b, bypasses test circuit 105b, and is routed to transmit pin 120b.

In various embodiments, an indication to enter the particular test mode may be provided by any suitable circuit, such as test circuit 105a in integrated circuit 101a, a different circuit in integrated circuit 101a, or a circuit in integrated circuit 101b. For example, in one embodiment a user may enable a given test mode of a plurality of test modes, via an interface associated with system 100. This enabling may cause test circuit 105a to enter the given test mode and to send, via interface circuit 110a, a corresponding test mode indication to test circuit 105b that the given test mode is being entered. In response to receiving the test mode indication via interface circuit 110b (e.g., via receive pin 125b), test circuit 105b enters a loop-back mode by coupling receive pin 125b to transmit pin 120b.

As used herein, a "loop-back" mode refers to a mode in which received signals are routed from a receive pin to a corresponding transmit pin, without gating the signal during the routing. For example, as shown in FIG. 1, to route signals from receive pin 125b to transmit pin 120b, test circuit 105b closes a switch that completes a path between the two pins. Such a switch may be implemented using one or more of any suitable types of transconductance devices, including for example, metal-oxide-semiconductor field-effect transistors (MOSFETs), FinFETs, and gate-all-around FETs (GAAFETs). It is noted that such a routing may not include latch circuits or any other type of circuit element that may cause a delay due to a reliance on a clock signal. As a voltage level of a circuit node of receive pin 125b transitions, a corresponding voltage level on a circuit node on transmit pin 120b may also transition with delays only due to an impedance of the routed path between the circuit nodes.

As illustrated, test circuit 105a is further configured to receive routed test signal 130b on receive pin 125a via conductive path 135b. Sent test signal 130a may include one or more transitions (e.g., a voltage level change from a low logic level to a high logic level, or vice versa) that correspond, for example, to one or more bits of test data. Test circuit 105a asserts sent test signal 130a on transmit pin 120a. Voltage levels associated with sent test signal 130a propagate though receive pin 125b, to transmit pin 120b, and then back to receive pin 125a, where test circuit 105a receives the test signal as routed test signal 130b. Information associated with routed test signal 130b is captured by test circuit 105a and, in some embodiments, may be stored in registers and/or memory circuits accessible to test circuit 105a. This information may include, for example, in the case of a digital signal, sampled data and an indication of transition times between received bits if more than one bit of data is received. If the test signal includes analog signaling, then the captured information may include indications of analog information such as voltage levels at various points in time. In some embodiments, analog signal information may be captured for digital test data.

Test circuit 105a, as depicted, is further configured to determine one or more qualities of conductive paths 135a and 135b using a comparison of sent test signal 130a and routed test signal 130b. The captured information is compared to information known about sent test signal 130a. For example, if sent test signal 130a includes digital data, then data sampled from routed test signal 130b is compared to the sent data to determine if any bits flipped logic values and/or if there was any unexpected delays between the sending and the receiving of the test signal 130. Analog information may be analyzed to determine if there was an unexpected degradation in voltage levels corresponding to logic high and logic low values. For example, if transmit pin 120a generates zero volts for a logic low and one volt for a logic high, then receiving, at receive pin 125a, 0.2 volts for a logic low and 0.8 volts for a logic high may be indicative of a lower-than-expected quality of conductive paths 135a and/or 135b.

By enabling a loop-back mode in integrated circuit 101b, integrated circuit 101a may generate a test signal and receive the routed version of the test signal, allowing integrated circuit 101a to perform a test of the conductive paths between the two integrated circuits without requiring any synchronization or additional transfer of test results between the two integrated circuits 101. This testing technique merely requires integrated circuit 101b to be put into the loop-back mode before integrated circuit 101a sends an initial test signal. Once integrated circuit 101b is in the loop-back mode, integrated circuit 101a may perform any suitable number of tests to evaluate any particular number of conductive paths included in the respective interface circuits.

It is noted that system 100, as illustrated in FIG. 1, is merely an example. The illustration of FIG. 1 has been simplified to highlight features relevant to this disclosure. Various embodiments may include different configurations of the circuit elements. For example, each interface circuit 110 is shown with one transmit and one receive pin, respectively. In other embodiments, any suitable number of transmit and receive pins may be included in the interface circuits, including for example, over one thousand pins. Although only two instances of the integrated circuit are shown, it is contemplated that additional instances may be included in other embodiments.

The interface circuits illustrated in FIG. 1 are shown with a signal transmit and single receive pin, each. Various interface circuits may include any suitable number of transmit and receive pins, including as disclosed, over one thousand. An example of interface circuits with additional pins is shown in FIG. 2.

Figure 2:
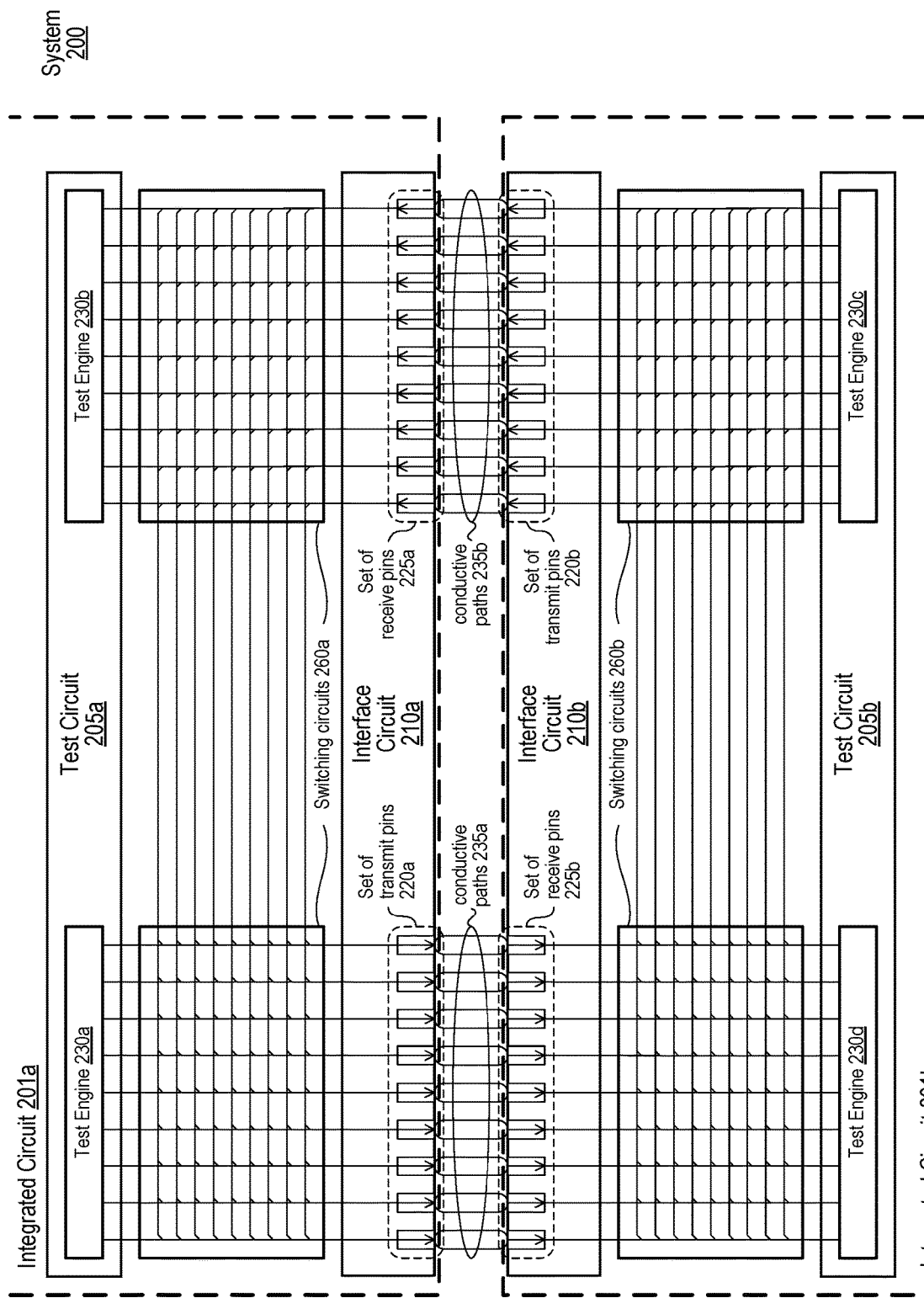
FIG. 2 shows a block diagram of an embodiment of system with two integrated circuits coupled together, each integrated circuit including respective sets of switching circuit.

Moving to FIG. 2, a block diagram of an embodiment of a system that includes two integrated circuits with external interfaces that include multiple transmit and multiple receive pins is shown. As illustrated, system 200 includes integrated circuits 201a and 201b (collectively integrated circuits 201). Each of integrated circuits 201 includes a respective one of: test circuits 205a and 205b, interface circuits 210a and 210b, and switching circuits 260a and 260b. Interface circuits 210a and 210b are shown with a respective one of sets of transmit pins 220a and 220b and a respective one of sets of receive pins 225a and 225b. Test circuits 205a and 205b each include a corresponding pair from test engines 230a-230d. Descriptions of elements in FIG. 2, except as described below, correspond to the descriptions provided for similarly named and numbered elements in FIG. 1.

As described above, integrated circuits 201 may each be a system-on-chip, including one or more processor cores, memory, and one or more peripheral circuits in addition to the illustrated elements. To improve a processing bandwidth of system 200, integrated circuits 201 are coupled together by connecting interface circuits 210a and 210b using conductive paths 235a and 235b. Using this coupling, integrated circuits 201 may be configured as a single system 200 in which the existence of multiple semiconductor dies is transparent to software executing on the single system 200. For example, memory subsystems on each die may be configured to utilize particular hashing techniques to ensure that memory accesses are distributed uniformly throughout system 200. Memory cache management circuits may implement coherence models such that coherency is enabled across the multiple dies.

As shown, integrated circuit 201a is configured to operate in a particular test mode in which a first version of a test packet is transmitted via set of transmit pins 220a. In order to test qualities of conductive paths 235a and 235b, integrated circuit 201a is configured to enter, for example, a BIST mode that includes generating, sending, and receiving a test packet. Test circuit 205a includes test engine 230a that is coupled to set of transmit pins 220a, and test engine 230b that is coupled to set of receive pins 225a. Test engine 230a is configured to generate the test packet, which includes one or more data words, each data word to be sent via set of transmit pins 220a and conductive paths 235a to integrated circuit 201b.

Integrated circuit 201b, as illustrated, is configured, in response to an indication that integrated circuit 201a is in the particular test mode, to receive the test packet at set of receive pins 225b. Successive data words from the test packet are received on set of receive pins 225b, and then routed to set of transmit pins 220b, bypassing test circuit 205b. In response to the indication that integrated circuit 201a is in the particular test mode, test circuit 205b enables particular ones of switching circuits 260b such that ones of set of receive pins 225b are coupled to respective ones of set of transmit pins 220b. The indication may be received before a first data word of the test packet is sent by test engine 230a, allowing the particular ones of switching circuits 260b to be enabled before the first data word arrives at set of receive pins 225b.

Each received data word, as shown, is routed to set of transmit pins 220b, and through conductive paths 235b back to integrated circuit 201a via set of receive pins 225a. The paths that are enabled to couple set of receive pins 225b to set of transmit pins 220b, including switching circuits 260b, may exclude use of clocked gates, thereby allowing the received data words of the test packet to propagate back to integrated circuit 201a without synchronization of test circuit 205b, or any other clocked logic circuits in integrated circuit 201b, to test circuit 205a. Test engine 230a may be configured to control the timing of when each data word of the test packet is sent and how long each data word remains valid.

As illustrated, a second version of the test packet is received by set of receive pins 225a. In some cases, the first and second versions of the test packet may have little to no difference, which may be an indication that conductive paths 235a and 235b have sufficient qualities to enable proper operation of system 200. In other cases, one or more of conductive paths 235a and 235b may have a particular quality that causes the second version to differ from the first version of the test packet, thereby indicating that there may be an issue with one or more of the conductive paths. To make such a determination, integrated circuit 201a, in response to receiving the second version of the test packet at set of receive pins 225a during the particular test mode, is configured to use test circuit 205a to compare the first and second versions of the test packet.

In some embodiments, test engine 230b may include circuits for detecting various qualities of the received data words of the second version of the test packet. For example, test engine 230b may be capable of detecting signal transition times and voltage levels on each pin of set of receive pins 225a. In various embodiments, voltage levels may be determined as being above or below one or more threshold voltage levels or may be measured using an analog-to-digital circuit. Additional details regarding the capabilities of the test engines will be presented below. The detected qualities of the second version of the test packet may be stored in a memory and/or register circuits included in or coupled to test circuit 205a. Test circuit 205a, or another circuit in integrated circuit 201a may perform the comparison of the first and second versions of the test packet.

In one embodiment, test engine 230a may send details of the first version of the test packet to test engine 230b as data words of the test packet are sent, and test engine 230b may perform the comparison. In other embodiments, both test engines 230a and 230b may send respective information regarding the first and second versions of the test packet to a different circuit within test circuit 205a or to a different circuit elsewhere in integrated circuit 201a, such as to a processor core, to perform the comparison.

In response to the comparison of the first and second versions of the test packet, test circuit 205a, or a different circuit that is performing the comparison, may determine that one or more of conductive paths 235a and 235b has marginal qualities. In such a case, a different test mode may be entered by integrated circuits 201a and 201b. For example, integrated circuit 201b may enter a BIST mode while integrated circuit 201a enters a loop-back mode. In such an embodiment test circuit 205a is further configured to, in response to entering the different test mode, route signals from set of receive pins 225a to set of transmit pins 220a, such that a second test packet received by set of receive pins 225a bypasses test circuit 205a, and is routed to set of transmit pins 220a.

Meanwhile, integrated circuit 201b, as shown, enters a different mode such as BIST. The coupling between set of receive pins 225b and set of transmit pins 220b is disabled. Test circuit 205b is further configured to send a first version of the second test packet via set of transmit pins 220b. In a manner as described above, test engine 230c may generate and send, via set of transmit pins 220b and conductive paths 235b, one or more data words included in the first version of the second test packet. The data words of the second test packet are routed, through switching circuits 260a, from set of receive pins 225a to set of transmit pins 220a, and back to set of receive pins 225*b* via conductive paths 235*b*. Test circuit 205*b*, using test engine 230*d*, is configured to receive a second version of the second test packet on set of receive pins 225*b*. Test circuit 205*b* may be further configured to determine one or more qualities of conductive paths 235*a* and 235*b* using a comparison of the first and second versions of the second test packet. As described above, the comparison may, in various embodiments, may be performed by one or both of test engines 230*c* and 230*d*, by a different circuit within or external to test circuit 205*b*, or by a different integrated circuit coupled to integrated circuit 201*b*.

It is noted that the embodiment of FIG. 2 is one example. In other embodiments, a different combination of elements may be included. For example, one or more processor cores and other peripherals may be included. A communication network may be included to enable communication among the processing cores and the peripherals. The illustrated interface circuits may be utilized to couple the networks from each integrated circuit such that the coupled networks perform as a single network across both integrated circuits. Although FIG. 2 depicts 18 pins included in each interface circuit, in other embodiments, any suitable number of pins may be included.

In the description of FIGS. 1 and 2, various pairs of transmit and receive pins of an interface circuit are described as being routed to one another. Various techniques may be utilized to route pins to one another. An integrated circuit that demonstrates one embodiment of how transmit and receive pins may be routed is shown in FIG. 3.

Figure 3:
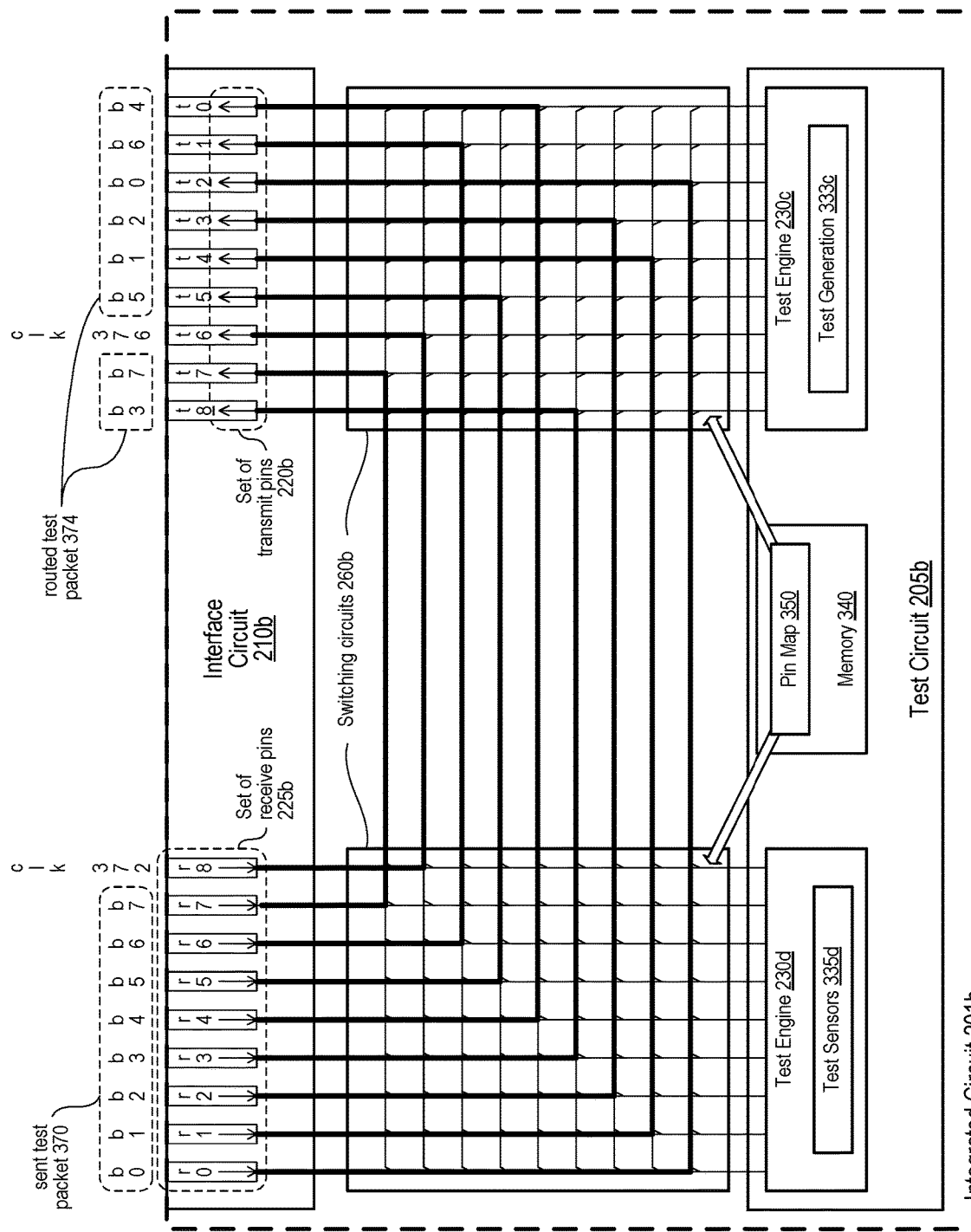
FIG. 3 depicts a block diagram of an embodiment of an integrated circuit utilizing a particular pin map to configure switching circuits.

Turning to FIG. 3, a block diagram of an integrated circuit that utilizes a pin map for routing receive pins to transmit pins is shown. Integrated circuit 201*b* from FIG. 2 is shown with set of receive pins 225*b* routed to respective ones of set of transmit pins 220*b*. The routing between each pair of receive and transmit pins is highlighted by a thick line. As previously described, test circuit 205*b* includes test engines 230*c* and 230*d*. In FIG. 3, test circuit 205*b* is further shown to include memory 340, in which pin map 350 is stored. Test engines 230*c* and 230*d* are also depicted as including test generation circuit 333*c* and test sensors 335*d*, respectively.

As illustrated, test circuit 205*b* is configured to route signals from a given one of set of receive pins 225*b* to a respective one of set of transmit pins 220*b* based on pin map 350. To route the sent test packet that is, as described above, received from integrated circuit 201*a*, from set of receive pins 225*b* to set of transmit pins 220*b*, integrated circuit 201*b* uses pin map 350 to route particular ones of set of receive pins 225*b* to mapped ones of set of transmit pins 220*b*. Pin map 350 includes values that indicate, for a given pin of set of receive pins 225*b*, to which pin of set of transmit pins 220*b* the given pin is routed. As shown for example, pin map 350 indicates that receive pin r8 is mapped to transmit pin t6, and that receive pin r6 is mapped to transmit pin t1.

Pin map 350, as shown, is stored in memory 340 within test circuit 205*b*. Memory 340 may, in some embodiments, be located elsewhere in integrated circuit 201*b*, but remain accessible to test circuit 205*b*. Memory 340 may include any suitable type of memory devices. For example, memory 340 may include register circuits and/or random-access memory (RAM). In such embodiments, pin map 350 may be received and stored from other circuits in integrated circuit 201*b*, such as from a processor core. In other embodiments, memory 340 may be a nonvolatile memory such as fuses or read-only memory (ROM). Memory 340 and pin map 350 may, in some embodiments, correspond to a logic circuit such that an enabling of a particular test mode results in the logic circuits causing switching circuits 260*b* to implement pin map 350.

In the illustrated embodiment, switching circuits 260*b* are capable of routing any pin of set of receive pins 225*b* to any corresponding pin of set of transmit pins 220*b*. In other embodiments, the number of combinations of pin maps 350 may be more limited, including, for example, limiting the mapping to a single combination. As described above in regards to FIG. 1, switching circuits 260*b* may be implemented using any suitable type of switching circuit elements.

When, as described above in regards to FIG. 2, integrated circuit 201*a* (not shown in FIG. 3) sends sent test packet 370 to integrated circuit 201*b*, integrated circuit 201*a* is further configured to send clock signal (clk) 372 on a particular one of set of transmit pins 220*a* (also not shown in FIG. 3). As shown, clock signal 372 is received by receive pin r8 of set of receive pins 225*b*, which is then routed back to integrated circuit 201*a* via transmit pin t6. In parallel, sent test packet 370 is received by pins r0-r7 of set of receive pins 225*b* and is routed back to integrated circuit 201*a* using pins t0-t5 and t7-t8 of set of transmit pins 220*b*. Test circuit 205*a* in integrated circuit 201*a*, in response to a detection of a particular transition of clock signal 372 on a particular one of set of receive pins 225*a*, is further configured to sample a routed data word of routed test packet 374 on the remaining ones of set of receive pins 225*a*.

When integrated circuit 201*b* is in a different test mode other than the loop-back mode, pin map 350 is not used and switching circuits 260*b* may be configured to route set of receive pins 225*b* to test engine 230*d*, and route set of transmit pins 220*b* to test engine 230*c*. In the different test mode, test engine 230*c* is configured to generate a different test packet to send to integrated circuit 201*a* which is, in turn, placed into a loop-back mode, with pins of set receive pins 225*a* mapped to respective pins of set of transmit pins 220*a*, using a corresponding pin map stored in integrated circuit 201*a*.

To generate the different test packet, test engine 230*c* uses test generation circuit 333*c*. Test generation circuit 333*c* may include, or have access to memory or register circuits that store one or more data words to be used as part of the different test packet. Test generation circuit 333*c* may include a random number generator circuit that is configured to generate random or pseudo random values that may be used for the one or more data words in the different test packet. In some embodiments, logic circuits may be included in test generation circuit that generate a particular repeatable series of data words for use in the different test pattern. Test generation circuit 333*c* may also include one or more timing circuits. These timing circuits may be used to determine when successive data words are sent and for how long each sent data word is valid. These timing circuits may include one or more types of clock generation circuits such as delay-locked loops, phase-locked loops, and/or oscillators, as well as timer and/or counter circuits.

Conductive paths 235*a* and 235*b*, in some embodiments, may be tested using one or more analog signals with varying voltage levels. In such embodiments, test generation circuit includes one or more voltage generation and/or voltage regulation circuits, including for example, digital-to-analog circuits, to generate the appropriate voltage levels to be used as test signals. In some embodiments, generated data values may be sent via set of transmit pins 220*b* using logic voltage levels that are different than what are used when integrated circuit 201*b* is not in a test mode. For example, if zero volts and one volt are used for logic low and high values, respectively, then in the different test mode, 0.3 volts and 0.7 volts may be used for the respective logic low and high values. It is contemplated that any suitable combination of test generating techniques may be used, and testing may be repeated using the different techniques.

The different test packet is sent via set of transmit pins 220b and routed, via integrated circuit 201a, back to set of receive pins 225b. Test engine 230d, as illustrated, uses test sensors 335d to sample the routed version of the different test packet. Test sensors 335d may include any suitable circuits for detecting qualities of received test signals associated with the different test packet. For example, comparator circuits may be used to determine a voltage level or range of voltage levels that correspond to logic lows and logic highs of the received test packet. Similar to test generation circuit 333c, test sensors 335d may include one or more timing circuits as described. These timing circuits may be used to determine temporal qualities of the received test packet, including for example, delays between when test generation circuit 333c sends a particular data word and when test sensors 335d detect signals associated with the particular data word. In some embodiments, some or all of the timing circuits may be shared between test generation circuit 333c and test sensors 335d. Test sensors 335d may further include one or more analog-to-digital converter circuits (ADCs) for determining a voltage level of the received signals at one or points in time.

It is noted that the integrated circuit of FIG. 3 is merely for demonstrating disclosed concepts. Integrated circuit 201b has been simplified to clearly illustrate the discussed elements. In other embodiments, additional sets of transmit and receive pins may be included in the interface circuit as well as additional switching circuits as desired. Other circuit blocks of integrated circuit 201b have been omitted for clarity.

Figure 4:
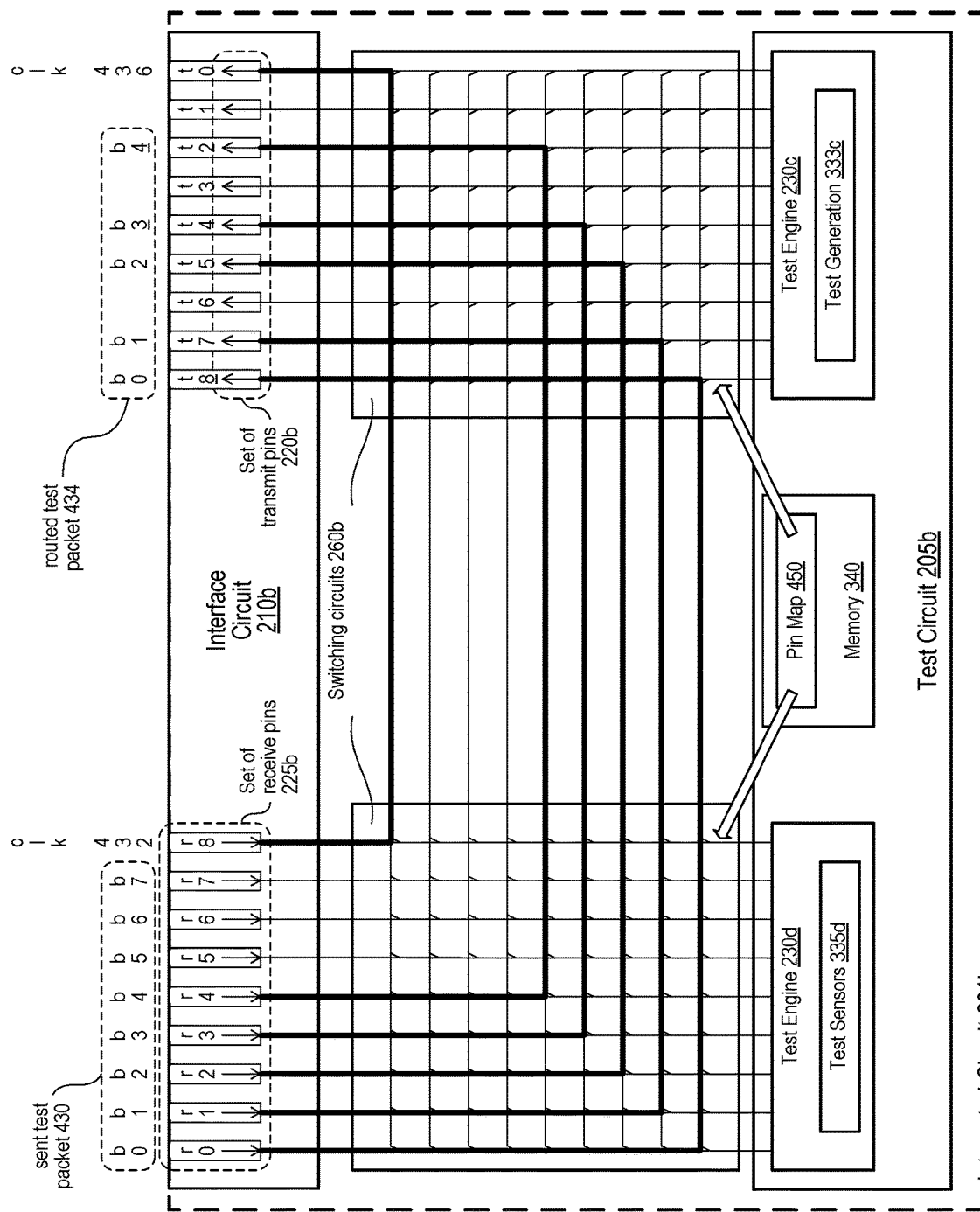
FIG. 4 illustrates a block diagram of an embodiment of an integrated circuit utilizing a different pin map to configure switching circuits.

FIG. 3 describes a technique for establishing a first pin mapping between receive and transmit pins. In FIG. 4, a different pin mapping is illustrated that provides another example for routing a plurality of receive pins to respective transmit pins.

Proceeding to FIG. 4, a block diagram of another embodiment of an integrated circuit that utilizes a different pin map for routing receive pins to transmit pins is depicted. Integrated circuit 201b from FIGS. 2 and 3 is shown with a subset of receive pins 225b routed to respective ones of set of transmit pins 220b. The routing between each pair of receive and transmit pins is again highlighted by a thick line. Memory 340 includes pin map 450, a different pin map that may be stored in addition to or in place of pin map 350.

As illustrated, integrated circuit 201b is configured to use a different mapping, as compared to FIG. 3, in response to an indication to enter a different test mode. As described above, test circuit 205b is configured, in response to entering a particular test mode, to route signals from ones of set of receive pins 225b to ones of set of transmit pins 220b based on pin map 350. As shown in FIG. 4, test circuit 205b is further configured, in response to entering a different test mode, to route signals from ones of set of receive pins 225b to different ones of set of transmit pins 220b based on pin map 450. Integrated circuit 201b, as well as integrated circuit 201a (not shown in FIG. 4), may include a plurality of test modes, including for example, a plurality of BIST modes and a plurality of loop-back modes.

As an example of utilizing a different pin map, after integrated circuit 201a performs a first BIST operation, results of the first test may, in some cases, indicate that one or more of the conductive paths 235a and 235b may have one or more qualities that are lower than expected. To further identify if the results were accurate and/or to identify a specific path (e.g., one of conductive paths 235a or one of conductive paths 235b), integrated circuit 201a (e.g., via an indication from a user of system 200) may enter a different BIST mode in which a different pin map (pin map 450) is used by integrated circuit 201b. As shown, ones of set of receive pins 225b are mapped to different ones of set of transmit pins 220b. Receive pin r0, for example, is routed to transmit pin t8, and receive pin r4 is routed to transmit pin t2. It is noted that pin map 450 does not include use of all pins of set of receive pins 225b and set of transmit pins 220b. Accordingly, routed test packet 434 does not include all bits of sent test packet 430. The limited mapping may be used to focus results on particular ones of the conductive paths, due to potential cross-talk between particular paths, due to limited resources on the side of integrated circuit 201a, or for any other suitable reason. In other embodiments, pin map 450 may route all pins that were used by pin map 350.

Referring back to FIG. 2, it is noted that this different mapping results in ones of conductive paths 235a being paired with different ones of conductive paths 235b for a particular bit of sent test packets. Performing additional tests with pin map 450 may enable an identification, e.g., by test circuit 205a in integrated circuit 201a, of a particular conductive path that is not performing to expectations. In various embodiments, an instance of system 200 in which such a conductive path is identified may be rejected as a test failure, may be reworked to attempt to correct the issue (e.g., by running system 200 through a solder re-flow process), may include indications that the identified path has substandard qualities and is to be used under limited conditions, or receive other similar dispositions.

It is noted that FIG. 4 is merely one example of the disclosed concepts. As previously described, additional numbers of transmit and receive pins may be included in other embodiments. Respective test engines are shown as being associated with nine transmit or nine receive pins. In other embodiments, a given test engine may be associated with any number of transmit or receive pins and, in some embodiments, may be associated with a combination of transmit and receive pins.

In FIGS. 1-4, integrated circuits are shown coupled via their respective interface circuits and placed into various configurations to perform evaluations on the interface circuits and the conductive paths enabling the coupling. Various forms of tests may be used as part this evaluation process. Two types of tests are depicted in FIG. 5.

Figure 5:
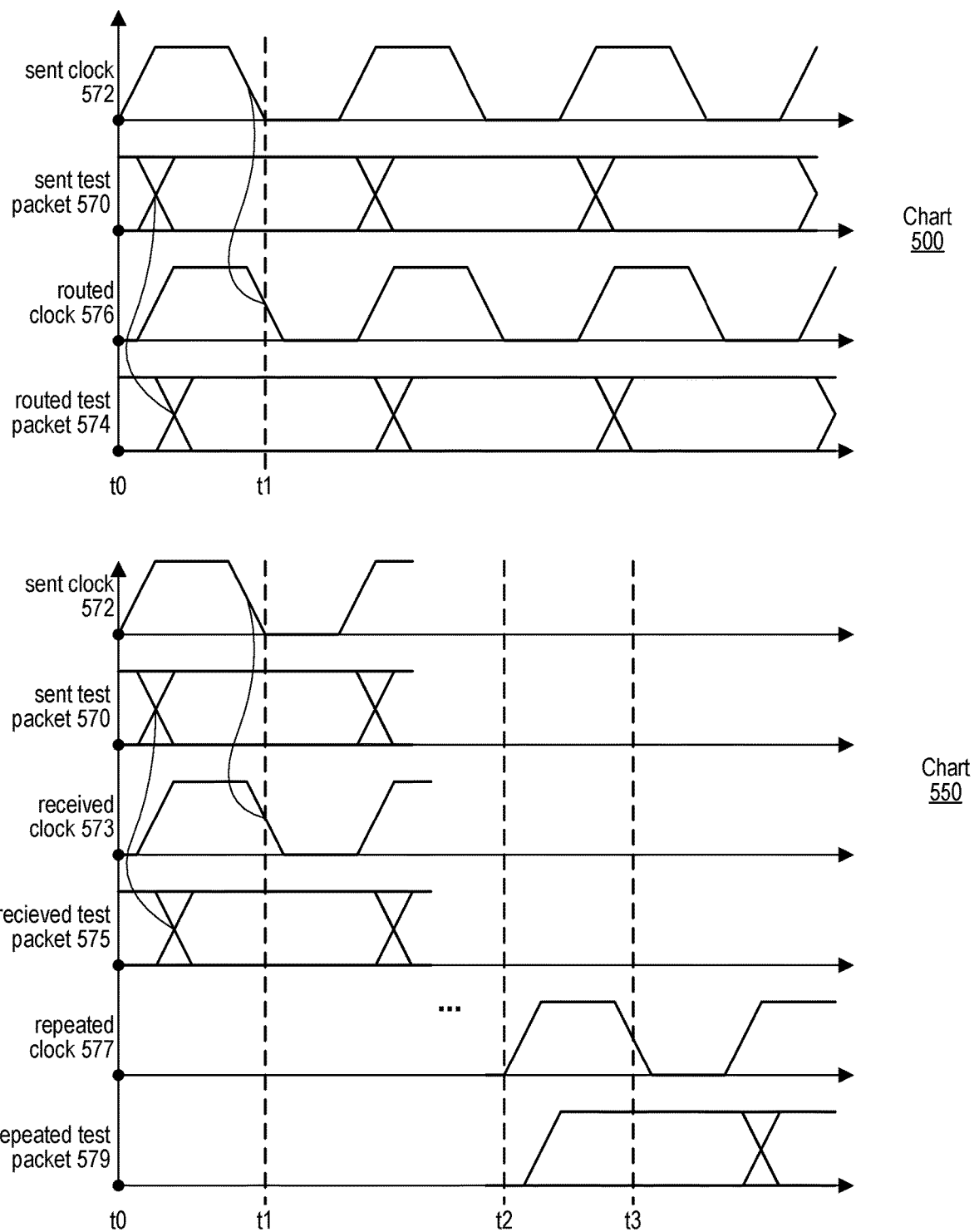
FIG. 5 shows two charts depicting examples of signals associated with test circuits included in a system with two integrated circuits.

Moving now to FIG. 5, two charts depicting waveforms associated with two different forms of tests are illustrated. Chart 500 depicts waveforms associated with a test technique between two integrated circuits in which one of the two integrated circuits is placed in a loop-back mode such as described above. Chart 550 depicts waveforms associated with a test technique between two integrated circuits in which a first integrated circuit sends a test packet that is received by a second integrated circuit and then sent back to the first integrated circuit. The waveforms include various versions of a clock signal and test packet that is sent by the first integrated circuit and received by the second integrated circuit. The waveforms depict logic voltage levels (y-axis) versus time (x-axis). Referring collectively to system 200 in FIG. 2 and FIG. 5, charts 500 and 550 begin at time t0 with integrated circuit 201a in a particular test mode and integrated circuit 201b is in either a loop-back mode (chart 500) or in an associated test mode (chart 550).

As shown in chart 500, a rising transition on sent clock 572 at time t0 triggers a data value included in sent test packet 570 to be asserted onto set of transmit pins 220a by test engine 230a. The transitions of sent clock 572 and sent test packet 570 propagate through conductive paths 235a to set of receive pins 225b on integrated circuit 201b. Since integrated circuit 201b is in a loop-back mode, set of receive pins 225b are routed to respective ones of set of transmit pins 220b. Accordingly, sent clock 572 and sent test packet 570 are routed back to integrated circuit 201a via conductive paths 235b and set of receive pins 225a and received by test engine 230b as routed clock 576 and routed test packet 574. Parasitic impedances in the complete paths of travel of the signals may result in a propagation delay between the sent and routed versions of the clock and test packet signals. If, however, all signal paths have similar parasitic impedances, then delays between the clock and test pack signals may be similar. A falling transition propagates from sent clock 572 at test engine 230a back to routed clock 576 at test engine 230b, causing test engine 230b to capture logic states of routed test packet 574. In some embodiments, additional test data associated with the signals of routed test packet 574 may be captured by test engine 230b.

As illustrated in chart 550, test engine 230a sends the same sent clock 572 and sent test packet 570 to integrated circuit 201b via set of transmit pins 235a. Integrated circuit 201b is in the associated test mode, and not in the loop-back mode, for this example. In the associated test mode, switching circuits 260b are disabled, and test circuit 205b is configured to receive signals sent by test engine 230a using test engine 230d. At time t0, sent clock 572 transitions to a high level and triggers the sending of sent test packet 570 as described above for chart 500. Test engine 230d captures values for received test packet 575 at time t1 in response to a falling transition of received clock 573. Since set of receive pins 225b are not routed to set of transmit pins 220b, test engine 230d sends the captured values (and any additional characteristics of the received signals that may have been captured) to test engine 230c via, for example, a bus circuit included in or coupled to test circuit 205b. Some amount of time, based on clock circuits of integrated circuit 201b, may pass before test engine 230c receives the captured data and is able to repeat, in response to a rising transition of repeated clock 577 at time t2, the captured data on set of transmit pins 220b as repeated test packet 579. Test engine 230b of integrated circuit 201a is able to capture values of repeated test packet 579 at time t3 in response to a falling transition of repeated clock 577.

It is noted that by using the loop-back mode as shown in chart 500, test engine 230b may be capable of determining a total propagation delay between sent test packet 570 and routed test packet 574 since test engines 230a and 230b may receive a same or otherwise synchronous clock signals to use as a common time base. In the example of chart 550, since repeated clock 577 and repeated test packet 579 are based off of clock signals generated in integrated circuit 201b, additional synchronization steps may be required to determine actual delays in signals travelling via conductive paths 235a and 235b. Any additional characteristics of the received signals that are captured by test engine 230d may be sent in a separate data packet from test engine 230c to test engine 230b, creating additional communication. Accordingly, use of loop-back mode for integrated circuit 201b may reduce a test time associated with evaluating qualities of conductive paths 235a and 235b as compared to a test procedure that utilizes test circuit 205b to repeat received test packets.

It is further noted that the charts of FIG. 5 are merely for demonstrating the disclosed techniques. The illustrated waveforms are simplified for clarity. Actual voltage levels for the associated signals may appear different due to various sources of signal noise such as power supply ripples due to voltage regulation methods, noise generate from other circuits in integrated circuits 201a and 201b, and the like. Additional signals may be associated with the disclosed test techniques, but are omitted for clarity.

The descriptions disclosed in regards to FIGS. 1-5 describe techniques for determining qualities of conductive paths used to couple two or more integrated circuits. Various physical properties of the conductive paths may affect qualities of signals travelling through the paths. These physical properties may be a result of a manufacturing inconsistencies and/or physical stresses placed on the system during and after manufacturing. Several examples of physical qualities are demonstrated in FIG. 6.

Figure 6:
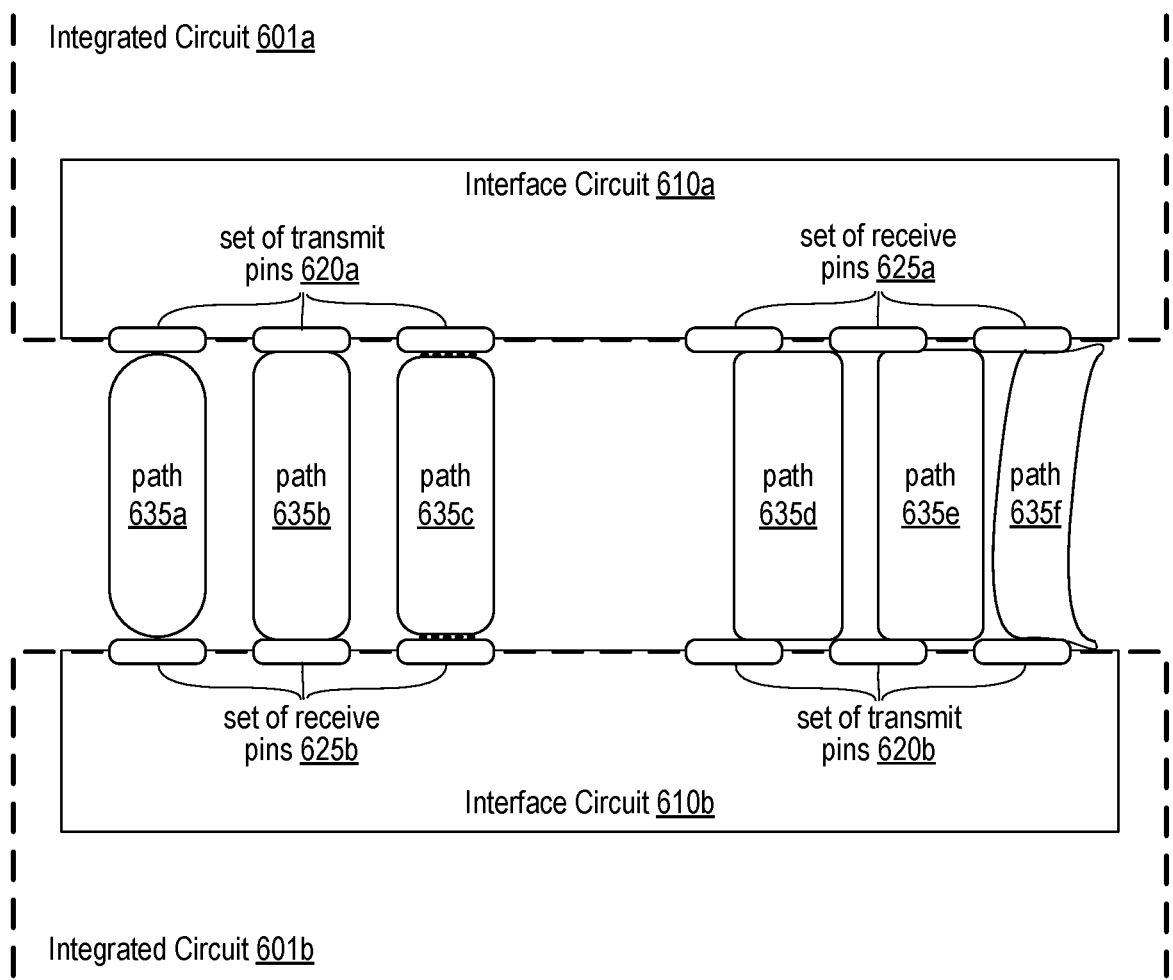
FIG. 6 illustrates a diagram depicting an embodiment of physical conductive paths between two integrated circuits that are coupled together.

Turning now to FIG. 6, a block diagram of two integrated circuits coupled by a plurality of conductive paths is shown. As illustrated, interface circuit 610a of integrated circuit 601a is coupled to interface circuit 610b of integrated circuit 601b via conductive paths (paths) 635a-635f (collectively 635). Interface circuits 610a and 610b include respective sets of transmit pins 620a and 620b, as well as respective sets of receive pins 625a and 625b.

To couple integrated circuits 601a and 601b (collectively 601), conductive paths 635 are physically attached from interface circuit 610a to interface circuit 610b. Set of transmit pins 620a are permanently attached to set of receive pins 625b, and set of transmit pins 620b are permanently attached to set of receive pins 625a. These permanent attachments may be created using a variety of methods. In some embodiments, the two integrated circuits may be placed on a co-planar surface with both ICs facing a same direction and with one IC rotated such that the pins of their respective external interfaces are aligned in a manner that allows the pins of the two external interfaces to be coupled using bond wires. In other embodiments, two ICs may be attached, face-to-face, using solder joints. In some such embodiments, an interposer circuit may be included between the dies of the two integrated circuits 601a and 601b. As shown in FIG. 6, conductive paths 635 may include any suitable combination of solder, bond wires, and interposer circuits.

As previously described, one or more qualities of conductive paths 635 may be determined using the disclosed techniques. Conductive path 635b depicts how a desired physical connection may appear. A large contact area covers a majority of the area of the coupled pins. Conductive path 635b also make solid contact with the pin at each end. Due to variations in manufacturing processes and/or stresses placed between integrated circuits 601, other ones of conductive paths 635 may not be properly aligned and or physically attached to pins of interface circuits 610a and 610b. For example, conductive path 635a has rounded ends that do not make as large a contact with a respective ones of set of transmit pins 620a and set of receive pins 625b. This may occur if, for example, a temperature of a soldering operation is too low or if an insufficient pressure is applied in a wire attachment process. This reduced contact area may increase a resistance and/or capacitance between the conductive path and the pins.

Conduct path 635c, in comparison, has a desirably large contact area, but the ends of the path have at least partially disconnected from the respective pins. This quality may result in an open connection or an increased resistance and/or capacitance with the respective pins. Such a condition may occur due to physical stress pushing or pulling integrated circuit 601a in a different direction that integrated circuit 601b, e.g., a shearing force. Conductive paths 635d-f are misaligned from their respective transmit and receive pins, resulting in smaller than desired contact between the respective pins and the conductive paths. In some case, conductive paths 635d and 635e may make a conductive contact with neighboring pins, resulting in shorts or cross talk between neighboring pins. In a similar manner, conductive path 635f may short to conductive path 635e due to bending in conductive path 635f.

As illustrated, to determine one or more qualities of conductive paths 635, integrated circuit 601a may, after performing test as described above, determine an impedance of one or more of conductive paths 635. For example, by determining propagation delays and/or signal degradation based on a comparison between sent and routed versions of one or more test signals, an impedance, open connections, shorted connections, may be estimated. A comparison between two or more test signals sent on adjacent paths may provide indications of shorts or cross talks between neighboring paths. In some cases, test signal may be resent on a subset of conductive paths 635. Determining one or more qualities may include determining an impedance between the subset of the conductive paths and other conductive paths excluded from the subset.

It is noted that the example of FIG. 6 is simplified for clarity. In other embodiments, additional conductive paths may be included to couple additional transmit and receive pins. Actual size and shape of the conductive paths may vary considerably from this simplified drawing.

The circuits and techniques described above in regards to FIGS. 1-6 disclose various techniques for testing conductive paths between two or more integrated circuits. Two methods performing these techniques are described below in regards to FIGS. 7 and 8.

Figure 7:
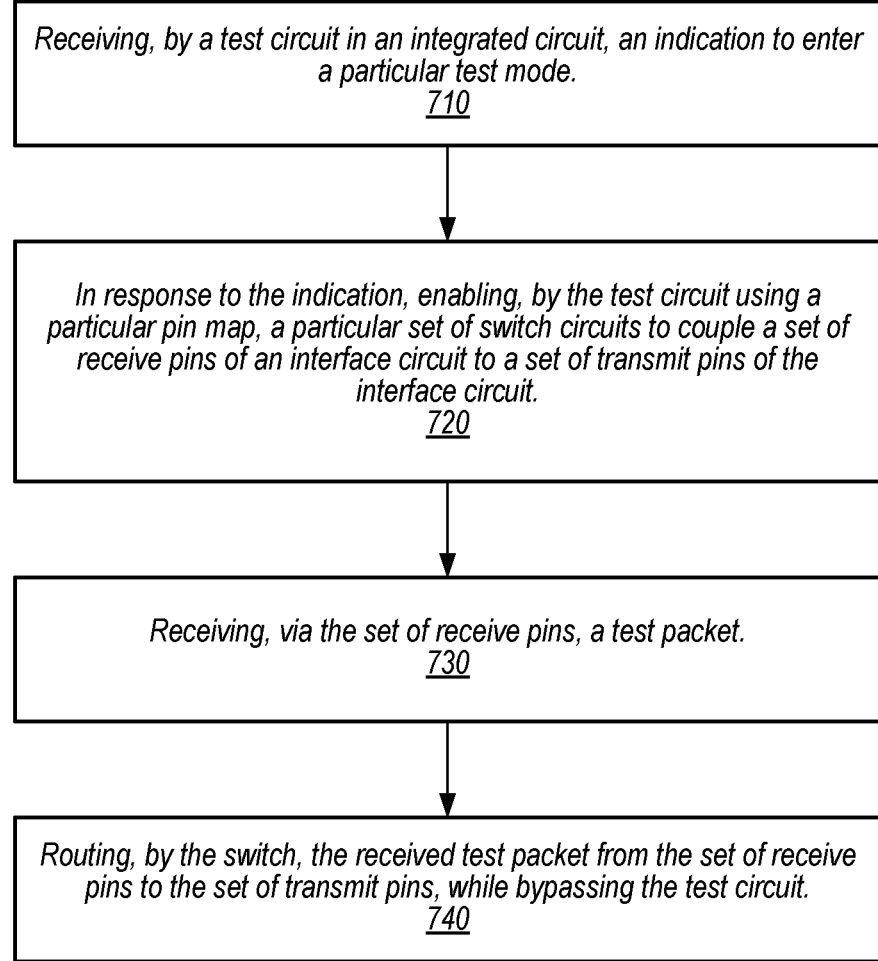
FIG. 7 shows a flow diagram of an embodiment of a method for testing conductive paths between external interfaces on respective integrated circuits.

Moving now to FIG. 7, a flow diagram for an embodiment of a method for routing signals from a set of receive pins to a set of transmit pins is illustrated. As illustrated, method 700 may be performed by a system with two or more integrated circuits, such as systems 100 and 200 in FIGS. 1 and 2. Referring collectively to FIGS. 2 and 7, method 700 begins in block 710.

Method 700, at block 710, includes receiving, by test circuit 205b in integrated circuit 201b, an indication to enter a particular test mode. As illustrated, test circuit 205b receives the indication from test circuit 205a in integrated circuit 201a via one or more of conductive paths 235a. In other embodiments, the indication to enter the particular test mode may be provided by any suitable circuit, such as a different circuit in integrated circuit 201a, or a given circuit included in integrated circuit 201b.

At block 720, method 700 includes in response to the indication, enabling, by test circuit 205b using a particular pin map, a particular set of switching circuits 260b to couple set of receive pins 225b of interface circuit 210b to set of transmit pins 220b of interface circuit 210b. The particular test mode, as illustrated, is a loop-back mode in which signals received on set of receive pins 225b are routed to set of transmit pins 220b without travelling through test circuit 205b. In some embodiments, test circuit 205b may also receive the routed signals, but the routing of the signals is not dependent on any action taken by test circuit 205b after the loop-back mode is enabled.

Method 700 also includes, at block 730, receiving, via set of receive pins 225b, a test packet. Integrated circuit 201a, as shown, enters a different test mode in combination with integrated circuit 201b entering the loop-back mode. For example, integrated circuit 201a may be in a BIST mode while integrated circuit 201b is in the loop-back mode. This combination of test modes allows test circuit 205a to send, via interface circuit set of transmit pins 220a and conductive paths 235a, a test packet that is received by set of receive pins 225b.

At block 740, method 700 includes routing, by switching circuits 260b, the received test packet from set of receive pins 225b to set of transmit pins 220b, while bypassing test circuit 205b. Enabled ones of switching circuits 260b provide a conductive route such that the sent test packet may be received by integrated circuit 201a at set of receive pins 225a. Since integrated circuit 201b does not impede the propagation of the test packet, other than delays caused by parasitic impedances present in integrated circuit 201b, test circuit 205a may, therefore, be capable of determining one or more qualities of conductive paths 235a and 235b based on a comparison of sent and received versions of the test packet. In some embodiments, the method may return to block 730 to receive additional test packets until an indication to exit the particular test mode is received.

In other embodiments, method 700 may include additional operations, such as, receiving an indication to enter a different test mode, and in response to this indication, enabling, by test circuit 205b using a different pin map, a different set of switching circuits 260b to couple set of receive pins 225b to set of transmit pins 220b. In some embodiments, using the different map comprises leaving at least one receive pin of set of receive pins 225b uncoupled to set of transmit pins 220b.

It is noted that FIG. 7 is merely an example method for routing data between an receive and transmit pins of an interface circuit of an integrated circuit. Method 700 may be performed by any instances of the integrated circuits disclosed in FIGS. 1-6. Variations of the disclosed method is contemplated, including the addition of operations to, for example, entering a different test mode that utilizes a different pin map in response to the determination of one or more qualities of conductive paths 235a and 235b.

Figure 8:
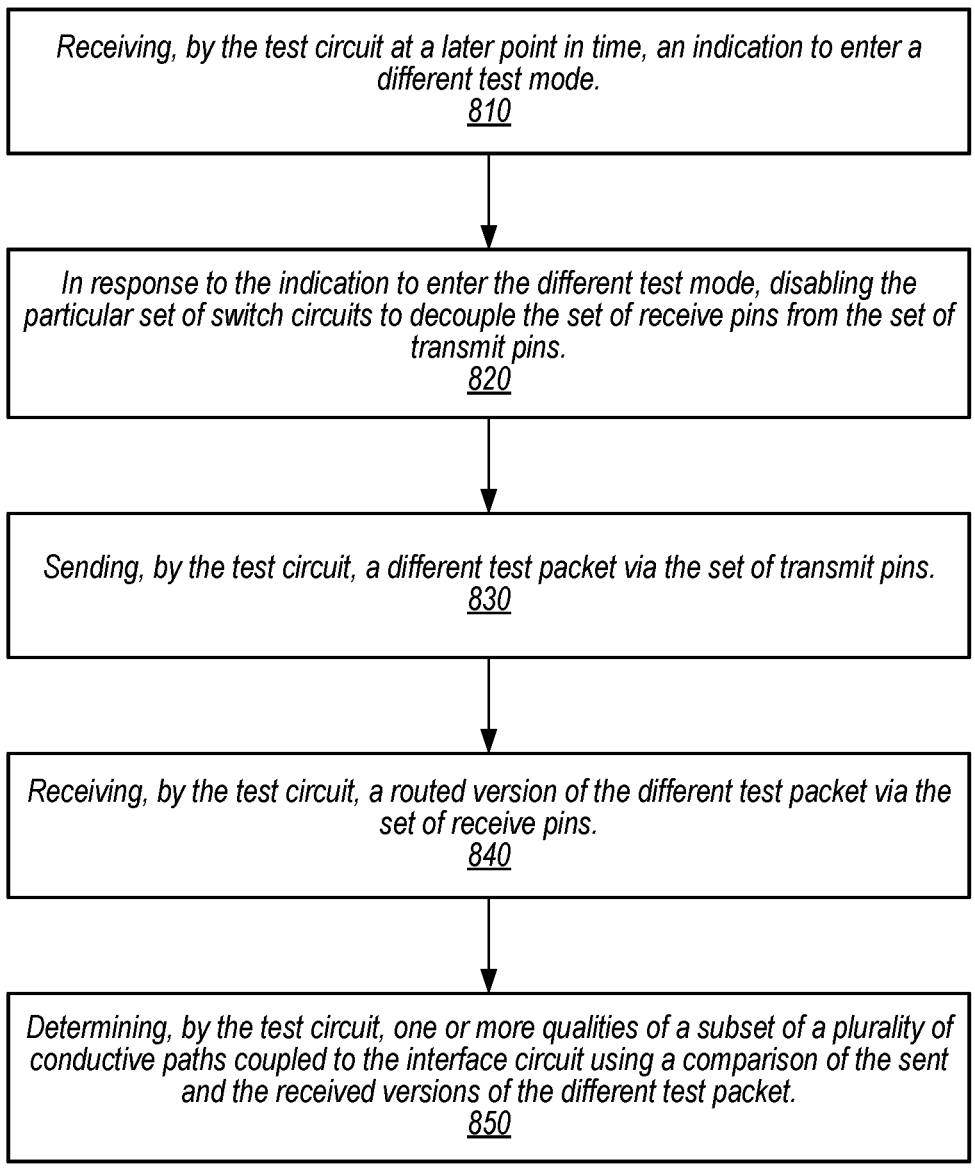
FIG. 8 illustrates a flow diagram of an embodiment of a method for entering a different test mode for testing conductive paths between external interfaces.

Turning now to FIG. 8, a flow diagram for an embodiment of a method for switching an integrated circuit to a different test mode is shown. In a manner similar to method 700, method 800 may also be performed by an integrated circuit in a system that includes two or more integrated circuits, such as systems 100 and 200 in FIGS. 1 and 2, respectively. Referring collectively to FIGS. 2 and 8, method 800 begins in block 810 after operations in block 740 of method 700 have been performed.

At block 810, method 800 includes receiving, by test circuit 205b at a later point in time, an indication to enter a different test mode. As illustrated, the different test mode is not a loop-back mode, but rather a test mode such as BIST. As part of an overall test process, integrated circuit 201b may begin in the loop-back mode while integrated circuit 201a performs a BIST procedure. After integrated circuit 201a completes the BIST procedure, integrated circuit 201b receives an indication to perform a BIST procedure while integrated circuit 201a is in a loop-back mode. This reversal of roles between the integrated circuits may be part of a typical testing process or may be initiated in response to results from the BIST procedure of integrated circuit 201a.

Method 800, at block 820, further includes disabling the particular set of switching circuits 260b to decouple set of receive pins 225b from set of transmit pins 220b. In response to entering the different test mode, integrated circuit 201b, as shown, exits the loop-back mode, including resetting switching circuits 260b such that no pins of set of receive pins 225b are coupled to any pins of set of transmit pins 220b. Test engines 230c and 230d may, if they were previously decoupled, be coupled to set of transmit pins 220b and set of receive pins 225b, respectively.

At block 830, method 800 also includes sending, by test circuit 205b a different test packet via set of transmit pins 220b. Test engine 230c, as illustrated, generates one or more data words to include in the test packet. The data words may be randomly generated, be part of a pseudo-random pattern, be part of a pattern file received by test circuit 205b, or generated in any other suitable fashion. The data words are sent via conductive paths 235b to set of receive pins 225a in integrated circuit 201a.

Method 800 further includes at block 840, receiving, by test circuit 205b, a routed version of the different test packet via set of receive pins 225b. As illustrated, integrated circuit 201a is in a loop-back mode that routes ones of set of receive pins 225a to respective ones of set of transmit pins 220a, according to a pin map included in test circuit 205a. Test engine 230d receives the routed version of the different test packet via set of receive pins 225b and conductive paths 235a.

At block 850, method 800 further includes determining, by test circuit 205b, one or more qualities of a subset of conductive paths 235a and 235b using a comparison of the sent and the received versions of the different test packet. As shown, test circuit 205b stores or otherwise has access to copies of the sent and routed versions of the different test packet. In addition, test circuit 205b may further store or have access to additional information regarding the sent and routed versions of the different test packet, such as voltage levels corresponding to logic high and low levels and timing information associated with the sending and receiving of the different test packet. Using the available information, test circuit 205b determines the one or more qualities. For example, if a common bit of the routed test packet is observed to be received later than other bits, then this may indicate a higher-than-expected amount of impedance on a corresponding one of conductive paths 235a and/or conductive paths 235b. The determined qualities may be provided to a user of system 200, or stored for later retrieval. In some embodiments, test circuit 205b may provide or store a simple indication that the BIST procedure passed if no unexpected results were determined, or provide an indication of one or more conductive paths for which unexpected results were determined.

In some embodiments, method 800 may end in block 850, or in other embodiments, may return to block 830 to send additional test packets. In some embodiments, method 800 may return to block 810 upon receiving an indication to enter a different version of the BIST mode, for example, a version of BIST mode in which integrated circuit 201a enters a different loop-back configuration with a different pin map. Method 800 may end after receiving an indication to exit the different test mode.

It is noted that the method of FIG. 8 is merely an example for performing a different test mode by an integrated circuit coupled to a different integrated circuit. Variations of the method are contemplated. For example, in block 850, different circuits other than test circuit 205b may be included in the determining of the one or more qualities of the conductive paths, such as a processor core included in integrated circuit 201b and/or a test circuit external to system 200.

Figure 9:
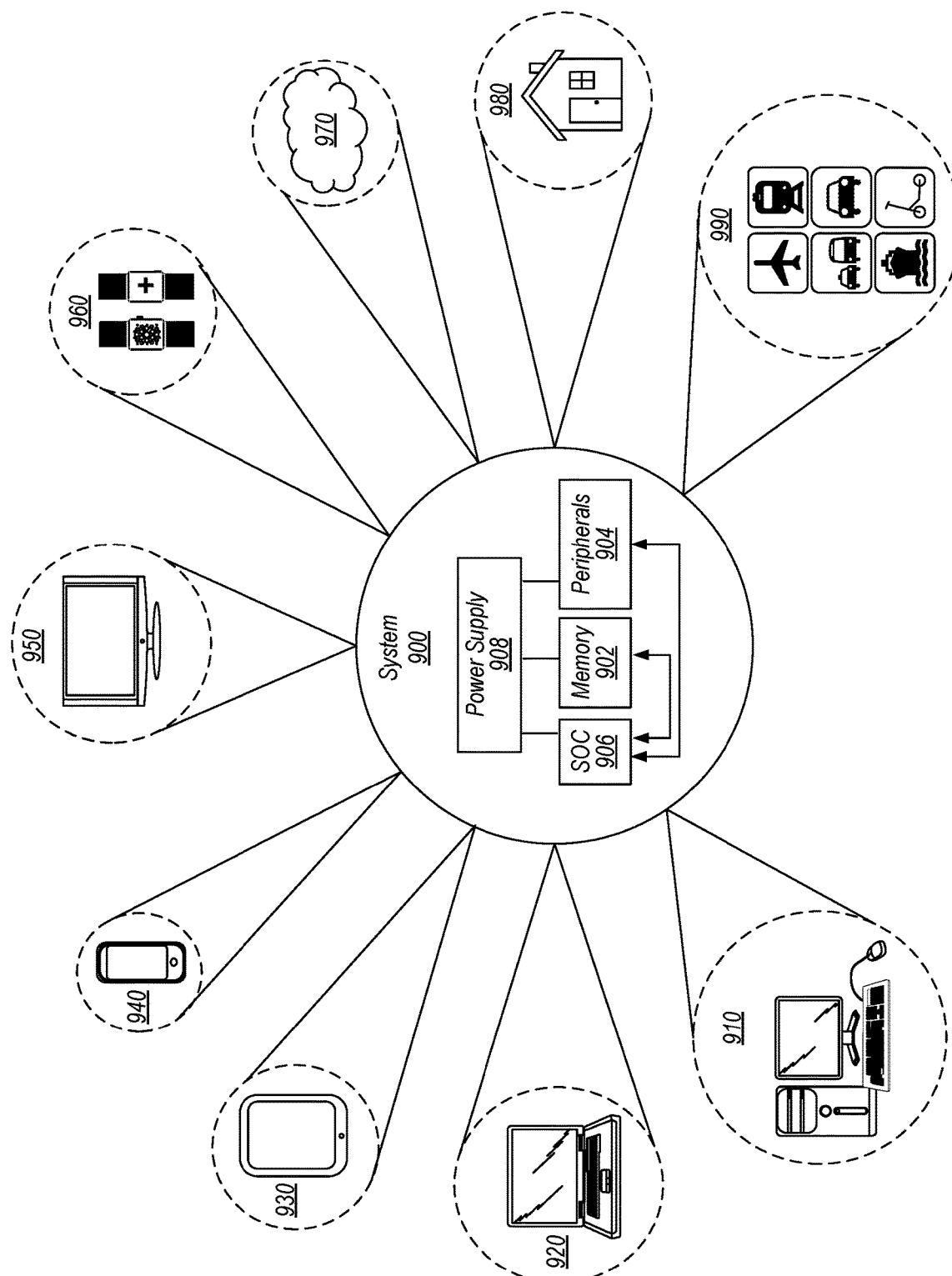
FIG. 9 depicts various embodiments of systems that include coupled integrated circuits.

FIGS. 1-8 illustrate apparatus and methods for a system that includes testing of conductive paths between two or more integrated circuits. Any embodiment of the disclosed systems may be included in one or more of a variety of computer systems, such as a desktop computer, laptop computer, smartphone, tablet, wearable device, and the like. In some embodiments, the circuits described above may be implemented on a system-on-chip (SoC) or other type of integrated circuit. A block diagram illustrating an embodiment of computer system 900 is illustrated in FIG. 9. Computer system 900 may, in some embodiments, include any disclosed embodiment of systems 100, 200, and 600.

In the illustrated embodiment, the system 900 includes at least one instance of a system on chip (SoC) 906 which may include multiple types of processing circuits, such as a central processing unit (CPU), a graphics processing unit (GPU), or otherwise, a communication fabric, and interfaces to memories and input/output devices. SoC 906 may, in some embodiments, correspond to one or both of integrated circuits 101a and 101b in FIGS. 1, 201a and 201b in FIGS. 2-4, and 601a and 601b in FIG. 6. One or more processors in SoC 906 may include multiple execution lanes and an instruction issue queue. In various embodiments, SoC 906 is coupled to external memory 902, peripherals 904, and power supply 908.

A power supply 908 is also provided which supplies the supply voltages to SoC 906 as well as one or more supply voltages to the memory 902 and/or the peripherals 904. In various embodiments, power supply 908 represents a battery (e.g., a rechargeable battery in a smart phone, laptop or tablet computer, or other device). In some embodiments, more than one instance of SoC 906 is included (and more than one external memory 902 is included as well).

The memory 902 is any type of memory, such as dynamic random-access memory (DRAM), synchronous DRAM (SDRAM), double data rate (DDR, DDR2, DDR3, etc.) SDRAM (including mobile versions of the SDRAMs such as mDDR3, etc., and/or low power versions of the SDRAMs such as LPDDR2, etc.), RAIVIBUS DRAM (RDRAM), static RAM (SRAM), etc. One or more memory devices are coupled onto a circuit board to form memory modules such as single inline memory modules (SIMMs), dual inline memory modules (DIMMs), etc. Alternatively, the devices are mounted with a SoC or an integrated circuit in a chip-on-chip configuration, a package-on-package configuration, or a multi-chip module configuration.

The peripherals 904 include any desired circuitry, depending on the type of system 900. For example, in one embodiment, peripherals 904 includes devices for various types of wireless communication, such as Wi-Fi, Bluetooth, cellular, global positioning system, etc. In some embodiments, the peripherals 904 also include additional storage, including RAM storage, solid state storage, or disk storage. The peripherals 904 include user interface devices such as a display screen, including touch display screens or multi-touch display screens, keyboard or other input devices, microphones, speakers, etc.

As illustrated, system 900 is shown to have application in a wide range of areas. For example, system 900 may be utilized as part of the chips, circuitry, components, etc., of a desktop computer 910, laptop computer 920, tablet computer 930, cellular or mobile phone 940, or television 950 (or set-top box coupled to a television). Also illustrated is a smartwatch and health monitoring device 960. In some embodiments, the smartwatch may include a variety of general-purpose computing related functions. For example, the smartwatch may provide access to email, cellphone service, a user calendar, and so on. In various embodiments, a health monitoring device may be a dedicated medical device or otherwise include dedicated health related functionality. For example, a health monitoring device may monitor a user's vital signs, track proximity of a user to other users for the purpose of epidemiological social distancing, contact tracing, provide communication to an emergency service in the event of a health crisis, and so on. In various embodiments, the above-mentioned smartwatch may or may not include some or any health monitoring related functions. Other wearable devices 970 are contemplated as well, such as devices worn around the neck, devices attached to hats or other headgear, devices that are implantable in the human body, eyeglasses designed to provide an augmented and/or virtual reality experience, and so on.

System 900 may further be used as part of a cloud-based service(s) 980. For example, the previously mentioned devices, and/or other devices, may access computing resources in the cloud (i.e., remotely located hardware and/or software resources). Also illustrated in FIG. 9 is the application of system 900 to various modes of transportation 990. For example, system 900 may be used in the control and/or entertainment systems of aircraft, trains, buses, cars for hire, private automobiles, waterborne vessels from private boats to cruise liners, scooters (for rent or owned), and so on. In various cases, system 900 may be used to provide automated guidance (e.g., self-driving vehicles), general systems control, and otherwise.

It is noted that the wide variety of potential applications for system 900 may include a variety of performance, cost, and power consumption requirements. Accordingly, a scalable solution enabling use of one or more integrated circuits to provide a suitable combination of performance, cost, and power consumption may be beneficial. These and many other embodiments are possible and are contemplated. It is noted that the devices and applications illustrated in FIG. 9 are illustrative only and are not intended to be limiting. Other devices are possible and are contemplated.

As disclosed in regards to FIG. 9, computer system 900 may include two or more integrated circuits coupled together and included within a personal computer, smart phone, tablet computer, or other type of computing device. A process for designing and producing an integrated circuit using design information is presented below in FIG. 10.

Figure 10:
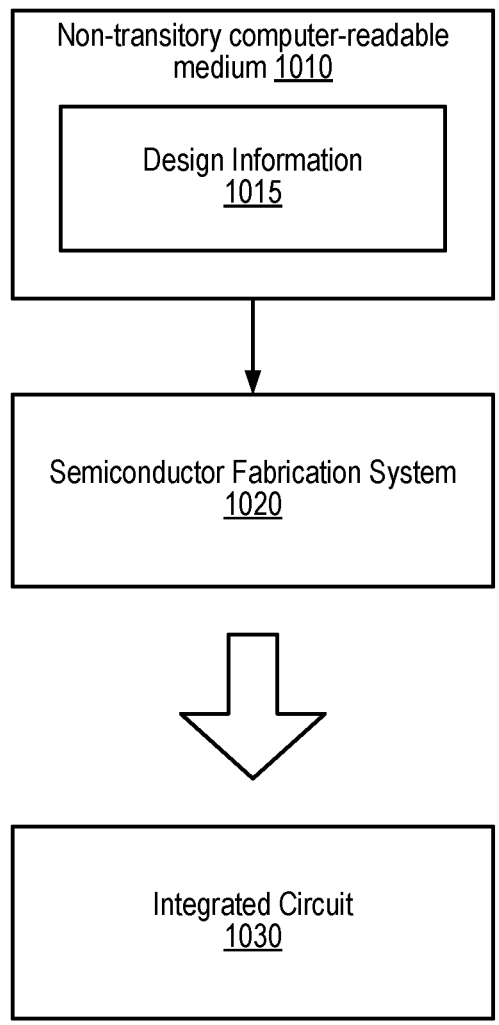
FIG. 10 shows a block diagram of an example computer-readable medium, according to some embodiments.

FIG. 10 is a block diagram illustrating an example of a non-transitory computer-readable storage medium that stores circuit design information, according to some embodiments. The embodiment of FIG. 10 may be utilized in a process to design and manufacture integrated circuits, such as, for example, integrated circuits 101, 201, and 601 as shown in multiple figures. In the illustrated embodiment, semiconductor fabrication system 1020 is configured to process the design information 1015 stored on non-transitory computer-readable storage medium 1010 and fabricate integrated circuit 1030 (e.g., integrated circuit 101) based on the design information 1015.

Non-transitory computer-readable storage medium 1010, may comprise any of various appropriate types of memory devices or storage devices. Non-transitory computer-readable storage medium 1010 may be an installation medium, e.g., a CD-ROM, floppy disks, or tape device; a computer system memory or random-access memory such as DRAM, DDR RAM, SRAM, EDO RAM, Rambus RAM, etc.; a non-volatile memory such as a Flash, magnetic media, e.g., a hard drive, or optical storage; registers, or other similar types of memory elements, etc. Non-transitory computer-readable storage medium 1010 may include other types of non-transitory memory as well or combinations thereof. Non-transitory computer-readable storage medium 1010 may include two or more memory mediums which may reside in different locations, e.g., in different computer systems that are connected over a network.

Design information 1015 may be specified using any of various appropriate computer languages, including hardware description languages such as, without limitation: VHDL, Verilog, SystemC, SystemVerilog, RHDL, M, MyHDL, etc. Design information 1015 may be usable by semiconductor fabrication system 1020 to fabricate at least a portion of integrated circuit 1030. The format of design information 1015 may be recognized by at least one semiconductor fabrication system, such as semiconductor fabrication system 1020, for example. In some embodiments, design information 1015 may include a netlist that specifies elements of a cell library, as well as their connectivity. One or more cell libraries used during logic synthesis of circuits included in integrated circuit 1030 may also be included in design information 1015. Such cell libraries may include information indicative of device or transistor level netlists, mask design data, characterization data, and the like, of cells included in the cell library.

Integrated circuit 1030 may, in various embodiments, include one or more custom macrocells, such as memories, analog or mixed-signal circuits, and the like. In such cases, design information 1015 may include information related to included macrocells. Such information may include, without limitation, schematics capture database, mask design data, behavioral models, and device or transistor level netlists. As used herein, mask design data may be formatted according to graphic data system (gdsii), or any other suitable format.

Semiconductor fabrication system 1020 may include any of various appropriate elements configured to fabricate integrated circuits. This may include, for example, elements for depositing semiconductor materials (e.g., on a wafer, which may include masking), removing materials, altering the shape of deposited materials, modifying materials (e.g., by doping materials or modifying dielectric constants using ultraviolet processing), etc. Semiconductor fabrication system 1020 may also be configured to perform various testing of fabricated circuits for correct operation.

In various embodiments, integrated circuit 1030 is configured to operate according to a circuit design specified by design information 1015, which may include performing any of the functionality described herein. For example, integrated circuit 1030 may include any of various elements shown or described herein. Further, integrated circuit 1030 may be configured to perform various functions described herein in conjunction with other components. Further, the functionality described herein may be performed by multiple connected integrated circuits, such as integrated circuits 201a and 201b in FIGS. 2-4.

As used herein, a phrase of the form "design information that specifies a design of a circuit configured to . . . " does not imply that the circuit in question must be fabricated in order for the element to be met. Rather, this phrase indicates that the design information describes a circuit that, upon being fabricated, will be configured to perform the indicated actions or will include the specified components.

The present disclosure includes references to "embodiments," which are non-limiting implementations of the disclosed concepts. References to "an embodiment," "one embodiment," "a particular embodiment," "some embodiments," "various embodiments," and the like do not necessarily refer to the same embodiment. A large number of possible embodiments are contemplated, including specific embodiments described in detail, as well as modifications or alternatives that fall within the spirit or scope of the disclosure. Not all embodiments will necessarily manifest any or all of the potential advantages described herein.

Unless stated otherwise, the specific embodiments are not intended to limit the scope of claims that are drafted based on this disclosure to the disclosed forms, even where only a single example is described with respect to a particular feature. The disclosed embodiments are thus intended to be illustrative rather than restrictive, absent any statements to the contrary. The application is intended to cover such alternatives, modifications, and equivalents that would be apparent to a person skilled in the art having the benefit of this disclosure.

Particular features, structures, or characteristics may be combined in any suitable manner consistent with this disclosure. The disclosure is thus intended to include any feature or combination of features disclosed herein (either explicitly or implicitly), or any generalization thereof. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

For example, while the appended dependent claims are drafted such that each depends on a single other claim, additional dependencies are also contemplated, including the following: Claim 3 (could depend from any of claims 1-2); claim 4 (any preceding claim); claim 5 (claim 4), etc. Where appropriate, it is also contemplated that claims drafted in one statutory type (e.g., apparatus) suggest corresponding claims of another statutory type (e.g., method).

Because this disclosure is a legal document, various terms and phrases may be subject to administrative and judicial interpretation. Public notice is hereby given that the following paragraphs, as well as definitions provided throughout the disclosure, are to be used in determining how to interpret claims that are drafted based on this disclosure.

References to the singular forms such "a," "an," and "the" are intended to mean "one or more" unless the context clearly dictates otherwise. Reference to "an item" in a claim thus does not preclude additional instances of the item.

The word "may" is used herein in a permissive sense (i.e., having the potential to, being able to) and not in a mandatory sense (i.e., must).

The terms "comprising" and "including," and forms thereof, are open-ended and mean "including, but not limited to."

When the term "or" is used in this disclosure with respect to a list of options, it will generally be understood to be used in the inclusive sense unless the context provides otherwise. Thus, a recitation of "x or y" is equivalent to "x or y, or both," covering x but not y, y but not x, and both x and y. On the hand, a phrase such as "either x or y, but not both" makes clear that "or" is being used in the exclusive sense.

A recitation of "w, x, y, or z, or any combination thereof" or "at least one of . . . w, x, y, and z" is intended to cover all possibilities involving a single element up to the total number of elements in the set. For example, given the set [w, x, y, z], these phrasings cover any single element of the set (e.g., w but not x, y, or z), any two elements (e.g., w and x, but not y or z), any three elements (e.g., w, x, and y, but not z), and all four elements. The phrase "at least one of . . . w, x, y, and z" thus refers to at least one of element of the set [w, x, y, z], thereby covering all possible combinations in this list of options. This phrase is not to be interpreted to require that there is at least one instance of w, at least one instance of x, at least one instance of y, and at least one instance of z.

Various "labels" may proceed nouns in this disclosure. Unless context provides otherwise, different labels used for a feature (e.g., "first circuit," "second circuit," "particular circuit," "given circuit," etc.) refer to different instances of the feature. The labels "first," "second," and "third" when applied to a particular feature do not imply any type of ordering (e.g., spatial, temporal, logical, etc.), unless stated otherwise.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical). More specifically, this formulation is used to indicate that this structure is arranged to perform the one or more tasks during operation. A structure can be said to be "configured to" perform some task even if the structure is not currently being operated. Thus, an entity described or recited as "configured to" perform some task refers to something physical, such as a device, circuit, memory storing program instructions executable to implement the task, etc. This phrase is not used herein to refer to something intangible.

The hardware circuits may include any combination of combinatorial logic circuitry, clocked storage devices such as flops, registers, latches, etc., finite state machines, memory such as static random access memory or embedded dynamic random access memory, custom designed circuitry, analog circuitry, programmable logic arrays, etc. Similarly, various units/circuits/components may be described as performing a task or tasks, for convenience in the description. Such descriptions should be interpreted as including the phrase "configured to."

In an embodiment, hardware circuits in accordance with this disclosure may be implemented by coding the description of the circuit in a hardware description language (HDL) such as Verilog or VHDL. The HDL description may be synthesized against a library of cells designed for a given integrated circuit fabrication technology, and may be modified for timing, power, and other reasons to result in a final design database that may be transmitted to a foundry to generate masks and ultimately produce the integrated circuit. Some hardware circuits or portions thereof may also be custom-designed in a schematic editor and captured into the integrated circuit design along with synthesized circuitry. The integrated circuits may include transistors and may further include other circuit elements (e.g. passive elements such as capacitors, resistors, inductors, etc.) and interconnect between the transistors and circuit elements. Some embodiments may implement multiple integrated circuits coupled together to implement the hardware circuits, and/or discrete elements may be used in some embodiments. Alternatively, the HDL design may be synthesized to a programmable logic array such as a field programmable gate array (FPGA) and may be implemented in the FPGA.

The term "configured to" is not intended to mean "configurable to." An unprogrammed FPGA, for example, would not be considered to be "configured to" perform some specific function. This unprogrammed FPGA may be "configurable to" perform that function, however.

Reciting in the appended claims that a structure is "configured to" perform one or more tasks is expressly intended not to invoke 35 U.S.C. § 112(f) for that claim element. Should Applicant wish to invoke Section 112(f) during prosecution, it will recite claim elements using the "means for" [performing a function] construct.

The phrase "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

The phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

What is claimed is:

1. An apparatus, comprising:
   a first integrated circuit, included in a particular chip package, including:
      a first interface circuit including a first transmit pin and a first receive pin; and
      a first test circuit configured to generate and send a test signal via the first transmit pin; and
   a second integrated circuit, included in the particular chip package, including:
      a second interface circuit including:
         a second receive pin coupled, via a first conductive path, to the first transmit pin; and
         a second transmit pin coupled, via a second conductive path, to the first receive pin; and
      a second test circuit configured to, in response to entering a particular test mode, route signals from the second receive pin to the second transmit pin, such that the sent test signal is received by the second receive pin, bypasses the second test circuit, and is routed to the second transmit pin;
   wherein the first test circuit is further configured to:
      receive the routed test signal on the first receive pin via the second conductive path; and
      determine one or more qualities of the first conductive path and the second conductive path using a comparison of the sent test signal and the routed test signal.

2. The apparatus of claim 1, wherein the second test circuit is further configured to couple the second receive pin to the second transmit pin in response to receiving a test mode indication via the second interface circuit.

3. The apparatus of claim 2, wherein the first test circuit is further configured to transmit the test mode indication via the first interface circuit in response to entering a given test mode of a plurality of test modes.

4. The apparatus of claim 1, wherein the first test circuit is further configured to, in response to entering a different test mode, route signals from the first receive pin to the first transmit pin, such that a second test signal received by the first receive pin, bypasses the first test circuit, and is routed to the first transmit pin.

5. The apparatus of claim 4, wherein the second test circuit is further configured to:
   send the second test signal via the second transmit pin;
   receive the routed second test signal on the second receive pin via the first conductive path; and
   determine one or more qualities of the first conductive path and the second conductive path using a comparison of the sent second test signal and the routed second test signal.

6. The apparatus of claim 1, wherein the first interface circuit further includes a third receive pin and the second interface circuit further includes a third transmit pin that is coupled to the third receive pin; and
   wherein the second test circuit is further configured to:
      route signals from the second receive pin to the second transmit pin based on a particular pin map; and
      in response to entering a different test mode, route signals from the second receive pin to the third transmit pin based on a different pin map.

7. The apparatus of claim 1, wherein the first and second conductive paths are permanent attachments between the first and second integrated circuits.

8. A method including:
   receiving, by a test circuit in first integrated circuit, an indication to enter a particular test mode;
   in response to the indication, enabling, by the test circuit using a particular pin map, a particular set of switch circuits to couple a set of receive pins of an interface circuit to a particular set of transmit pins of the interface circuit, wherein the set of receive pins and the particular set of transmit pins are coupled to a second integrated circuit;
   receiving, via the set of receive pins, a test packet;
   routing, by the switch circuits, the received test packet from the set of receive pins to the particular set of transmit pins, while bypassing the test circuit; and
   in response to an indication to enter a different test mode, enabling, by the test circuit using a different pin map, a different set of switch circuits to couple the set of receive pins to a different set of transmit pins.

9. The method of claim 8, wherein the different set of transmit pins includes at least one transmit pin from the particular set of transmit pins.

10. The method of claim 9, wherein using the different pin map comprises leaving at least one receive pin of the set of receive pins uncoupled to the different set of transmit pins.

11. The method of claim 8, further comprising, in response to an indication to enter a different test mode at a later point in time:
   disabling the particular set of switch circuits to decouple the set of receive pins from the particular set of transmit pins; and
   sending, by the test circuit a different test packet via the particular set of transmit pins.

12. The method of claim 11, further comprising:
   receiving, by the test circuit, a routed version of the different test packet via the set of receive pins; and
   determining, by the test circuit, one or more qualities of a subset of a plurality of conductive paths coupled to the interface circuit using a comparison of the sent and the routed versions of the different test packet.

13. The method of claim 12, wherein the one or more qualities of the conductive paths include determining an impedance of the subset of the conductive paths.

14. The method of claim 12, wherein the one or more qualities of the conductive paths include determining an impedance between the subset of the conductive paths and conductive paths excluded from the subset.

15. A system, comprising:
- a first integrated circuit included in a particular chip package, and having a first test circuit, a first set of transmit pins, and a corresponding first set of receive pins; and
- a second integrated circuit included in the particular chip package, and having a second test circuit, a second set of transmit pins, and a corresponding second set of receive pins;
- wherein the first integrated circuit is configured to operate in a particular test mode in which a first version of a test packet is generated and sent via the first set of transmit pins;
- wherein the second integrated circuit is configured, in response to an indication that the first integrated circuit is in the particular test mode, to:
  - receive the test packet at the second set of receive pins; and
  - route the test packet to the second set of transmit pins, bypassing the second test circuit; and
- wherein the first integrated circuit, in response to receiving a second version of the test packet at the first set of receive pins during the particular test mode, is configured to use the first test circuit to compare the first and second versions of the test packet.

16. The system of claim 15, wherein the first test circuit includes a first test engine coupled to the first set of transmit pins and a second test engine coupled to the first set of receive pins.

17. The system of claim 15, wherein to route the sent test packet from the second set of receive pins to the second set of transmit pins, the second integrated circuit is further configured to use a particular pin map to route particular ones of the second set of receive pins to mapped ones of the second set of transmit pins.

18. The system of claim 17, wherein the second integrated circuit is further configured to use a different mapping in response to an indication to enter a different test mode.

19. The system of claim 15, wherein the first integrated circuit is further configured to:
- send a clock signal on a particular one of the first set of transmit pins; and
- in response to a detection of a particular transition of the clock signal on a particular one of the first set of receive pins, sample the routed test packet on remaining ones of the first set of receive pins.

20. The system of claim 15, wherein the first set of transmit pins are permanently attached to the second set of receive pins, and the second set of transmit pins are permanently attached to the first set of receive pins.

* * * * *